US008039754B2

(12) United States Patent
Fink et al.

(10) Patent No.: US 8,039,754 B2
(45) Date of Patent: Oct. 18, 2011

(54) CONDUCTOR CARRIER AND ARRANGEMENT COMPRISING A CONDUCTOR CARRIER

(75) Inventors: Martin Fink, Lauterhofen (DE); Georg Fischer, Regensburg (DE)

(73) Assignee: Continental Automotive GmbH, Hanover (DE)

( * ) Notice: Subject to any disclaimer, the term of this patent is extended or adjusted under 35 U.S.C. 154(b) by 428 days.

(21) Appl. No.: 12/374,123

(22) PCT Filed: May 14, 2007

(86) PCT No.: PCT/EP2007/054649
§ 371 (c)(1),
(2), (4) Date: Feb. 25, 2009

(87) PCT Pub. No.: WO2008/009492
PCT Pub. Date: Jan. 24, 2008

(65) Prior Publication Data
US 2009/0229863 A1 Sep. 17, 2009

(30) Foreign Application Priority Data
Jul. 19, 2006 (DE) .......................... 10 2006 033 477

(51) Int. Cl.
*H05K 5/03* (2006.01)
*H05K 5/06* (2006.01)

(52) U.S. Cl. ..................... 174/254; 174/50.51; 174/251; 174/260; 361/749; 361/750; 361/765; 361/789; 29/830; 29/847; 29/852

(58) Field of Classification Search .............. 174/50.51, 174/50.52, 250, 52.3, 252–261, 268, 520; 361/749, 752, 760–767, 780, 789, 793, 794, 361/810, 804, 777; 29/825, 830, 832, 840, 29/841, 846, 847, 829, 592.1, 729, 745, 428, 29/852; 74/606 R, 607, 507; 438/106–108, 438/118, 612–618, 120; 200/83, 83 J, 83 R, 200/1 B, 61.89, 251; 257/698, 700, 787, 257/788
See application file for complete search history.

(56) References Cited

U.S. PATENT DOCUMENTS
3,026,234 A 3/1962 Eisler
(Continued)

FOREIGN PATENT DOCUMENTS
DE 19717760 A1 10/1998
(Continued)

OTHER PUBLICATIONS

"Interconnection Structure for Liquid Crystal Display" IBM Technical Disclosure Bulletim, IBM Corp., New York, USA, vol. 31, Nr. 10, Mar. 1, 1989 (1989-03-010), p. 1, XP000024024, ISSN: 0018-8689, the complete document (Book not included).
German Office Action dated Mar. 16, 2007.
International Search Report dated Jan. 7, 2008.

*Primary Examiner* — Michail V Datskovskiy
(74) *Attorney, Agent, or Firm* — Laurence A. Greenberg; Werner H. Stemer; Ralph E. Locher

(57) ABSTRACT

A conductor carrier includes a base insulating film, a contact insulating film, at least one first printed conductor and one second printed conductor. The contact insulating film includes at least one first recess and one second recess. The printed conductors are embedded between the two insulating films and each forms a first overlapping region with the first or second recess of the contact insulating film. The conductor carrier also includes an insulating region which separates the first printed conductor from the second printed conductor in an insulating manner due to the contact insulating film being less raised than outside the insulating region, and extends between the first and second recesses of the contact insulating film in a meandering manner. A configuration having the conductor carrier is also provided.

6 Claims, 3 Drawing Sheets

U.S. PATENT DOCUMENTS

| | | | | |
|---|---|---|---|---|
| 3,515,828 A | * | 6/1970 | Boerner | 200/83 R |
| 3,867,595 A | * | 2/1975 | Ramsey et al. | 200/86 R |
| 4,716,259 A | * | 12/1987 | Tokura et al. | 174/254 |
| 5,450,286 A | * | 9/1995 | Jacques et al. | 361/749 |
| 5,528,093 A | * | 6/1996 | Adam et al. | 310/89 |
| 6,064,014 A | * | 5/2000 | McCluskey et al. | 200/83 J |
| 6,160,708 A | * | 12/2000 | Loibl et al. | 361/704 |
| 6,183,290 B1 | * | 2/2001 | Loibl | 439/492 |
| 6,219,247 B1 | * | 4/2001 | Haupt et al. | 361/707 |
| 6,280,203 B1 | * | 8/2001 | Smirra | 439/77 |
| 6,300,565 B1 | * | 10/2001 | Loibl et al. | 174/520 |
| 6,329,617 B1 | * | 12/2001 | Burgess | 200/61.43 |
| 6,350,953 B1 | * | 2/2002 | Franzen | 174/528 |
| 6,392,148 B1 | * | 5/2002 | Ueno et al. | 174/72 A |
| 6,400,246 B1 | * | 6/2002 | Hill et al. | 335/205 |
| 6,461,527 B1 | | 10/2002 | Haupt et al. | |
| 6,515,228 B2 | * | 2/2003 | Albert et al. | 174/525 |
| 6,533,620 B2 | * | 3/2003 | Franzen et al. | 439/876 |
| 6,542,058 B2 | * | 4/2003 | Van Zeeland | 335/205 |
| 6,570,773 B1 | * | 5/2003 | Loibl et al. | 361/752 |
| 6,679,137 B1 | * | 1/2004 | Bek | 74/606 R |
| 6,683,566 B2 | * | 1/2004 | Jeon et al. | 342/383 |
| 6,770,818 B1 | * | 8/2004 | Puchegger | 174/100 |
| 6,797,888 B2 | * | 9/2004 | Ookawa et al. | 174/255 |
| 6,909,954 B2 | * | 6/2005 | Fischer et al. | 701/51 |
| 6,919,529 B2 | * | 7/2005 | Franzen et al. | 219/121.64 |
| 7,067,912 B2 | * | 6/2006 | Takeuchi et al. | 257/688 |
| 7,073,410 B2 | * | 7/2006 | Albert | 74/606 R |
| 7,182,606 B2 | * | 2/2007 | Ishii et al. | 439/66 |
| 7,466,519 B2 | * | 12/2008 | Wakaki et al. | 360/245.9 |
| 7,638,873 B2 | * | 12/2009 | Ishii et al. | 257/698 |
| 7,723,617 B2 | * | 5/2010 | Ishii et al. | 174/254 |
| 7,859,852 B2 | * | 12/2010 | Wetzel et al. | 361/749 |
| 7,885,080 B2 | * | 2/2011 | Janisch et al. | 361/757 |
| 7,952,885 B2 | * | 5/2011 | Loibl et al. | 361/749 |
| 2002/0081894 A1 | | 6/2002 | Fuerst et al. | |

FOREIGN PATENT DOCUMENTS

| | | |
|---|---|---|
| DE | 19929179 A1 | 1/2001 |
| EP | 1217695 A2 | 6/2002 |
| JP | 11054175 A | 2/1999 |
| JP | 2003092476 A * | 3/2003 |

* cited by examiner

CONDUCTOR CARRIER AND ARRANGEMENT COMPRISING A CONDUCTOR CARRIER

BACKGROUND OF THE INVENTION

Field of the Invention

The invention relates to a conductor carrier that includes a base-insulating film, a contact-insulating film, and at least one first and one second printed conductor. The first and second printed conductor are embedded between the two insulating films.

Electronic control elements are routinely arranged in a decentralized manner in motor vehicles. For example in an automatic transmission for motor vehicles the corresponding control electronics and sensors associated therewith are installed in the automatic transmission's gearbox. There are similar trends towards "in-situ electronics" in other motor-vehicle domains also, for example in the case of engine controls and brake systems. Flexible conductor carriers for distributing electronic signals and currents are especially suitable therefor owing to the restricted installation space. Conductor carriers of said type routinely consist of two polyimide films between which conducting copper paths are embedded.

If said type of conductor carriers are installed in the gearbox, for example, then non-insulated points of contact of the conductor carriers have to be sealed off from particles in the surrounding medium, for example oil. The ingress of one of the particles into the region of the conductor carrier's non-insulated point of contact can cause the control electronics that include the conductor carrier to be short-circuited and hence destroyed and/or damaged.

BRIEF SUMMARY OF THE INVENTION

The object of the invention is to provide a conductor carrier and an arrangement having the conductor carrier that make particle-tight contacting of the conductor carrier possible in a simple manner.

The object is achieved by means of the features of the independent claims. Advantageous embodiments of the invention are disclosed in the subclaims.

The invention is distinguished in terms of a first of its aspects by a conductor carrier. The conductor carrier includes a base-insulating film, a contact-insulating film, at least one first and one second printed conductor, and an insulating region. The contact-insulating film has at least one first and one second recess. The first and second printed conductor are embedded between the two insulating films. The first and second printed conductor form in each case with respectively the first and second recess of the contact-insulating film a first overlapping region. The insulating region separates the first printed conductor from the second printed conductor in an insulating manner. The contact-insulating film is less raised inside the insulating region than outside the insulating region. The insulating region extends at least between the first and second recess of the contact-insulating film in a meandering fashion.

If the conductor carrier is sealed off from its surroundings in the region of the contact-insulating film's recesses, then the insulating region's meandering course will in a simple manner help lessen the ingress of particles into the sealed-off region.

According to a second of its aspects the invention is distinguished by an arrangement having a contact plate, a base plate, and the conductor carrier. The contact plate has at least one first and one second electric contact. The conductor carrier is arranged between the contact plate and base plate in such a way that the first and second printed conductor are electrically coupled within the first overlapping region to the first and second electric contact respectively. The arrangement furthermore has a pressure body that is arranged between the base plate and base-insulating film and embodied in such a way that the contact-insulating film will be pressed by the pressure body against the contact plate in a pressure region. The pressure region includes in each case the contact-insulating film's first and second recess. The pressure region forms a second overlapping region with the insulating region.

The pressure body insures that the recesses and, in particular, the electric contacts of the printed conductors are sealed off well from their surroundings outside the pressure region. In the insulating region said region's meandering course makes it more difficult for particles to penetrate the pressure region. That helps in a simple and effective manner to provide extensively particle-tight contacting of the conductor carrier at the electric contacts. In another advantageous embodiment of the arrangement the base plate has a recess in the region of the pressure body. The pressure body is located in the base plate's recess and projects therefrom. That helps in a simple manner to precisely secure and/or position the pressure body.

In another advantageous embodiment of the arrangement the pressure body encompasses two cylindrical partial bodies. The edges of the cylindrical partial bodies press onto the conductor carrier, thereby defining the pressure region. The cylindrical partial bodies' edges help to provide a simple embodiment of the pressure region.

In another advantageous embodiment of the arrangement the pressure body includes a first and second pot-shaped partial body whose side walls encompass the cylindrical partial bodies. The pot bases of the pot-shaped partial bodies help in a simple manner to insure the pressure body's stability.

In another advantageous embodiment of the arrangement the pressure body is embodied as a single piece. That helps to insure the pressure body will be easy to assemble.

BRIEF DESCRIPTION OF SEVERAL VIEWS OF THE DRAWING

The invention is explained in more detail below with the aid of schematics.

DESCRIPTION OF THE INVENTION

Figure 1:
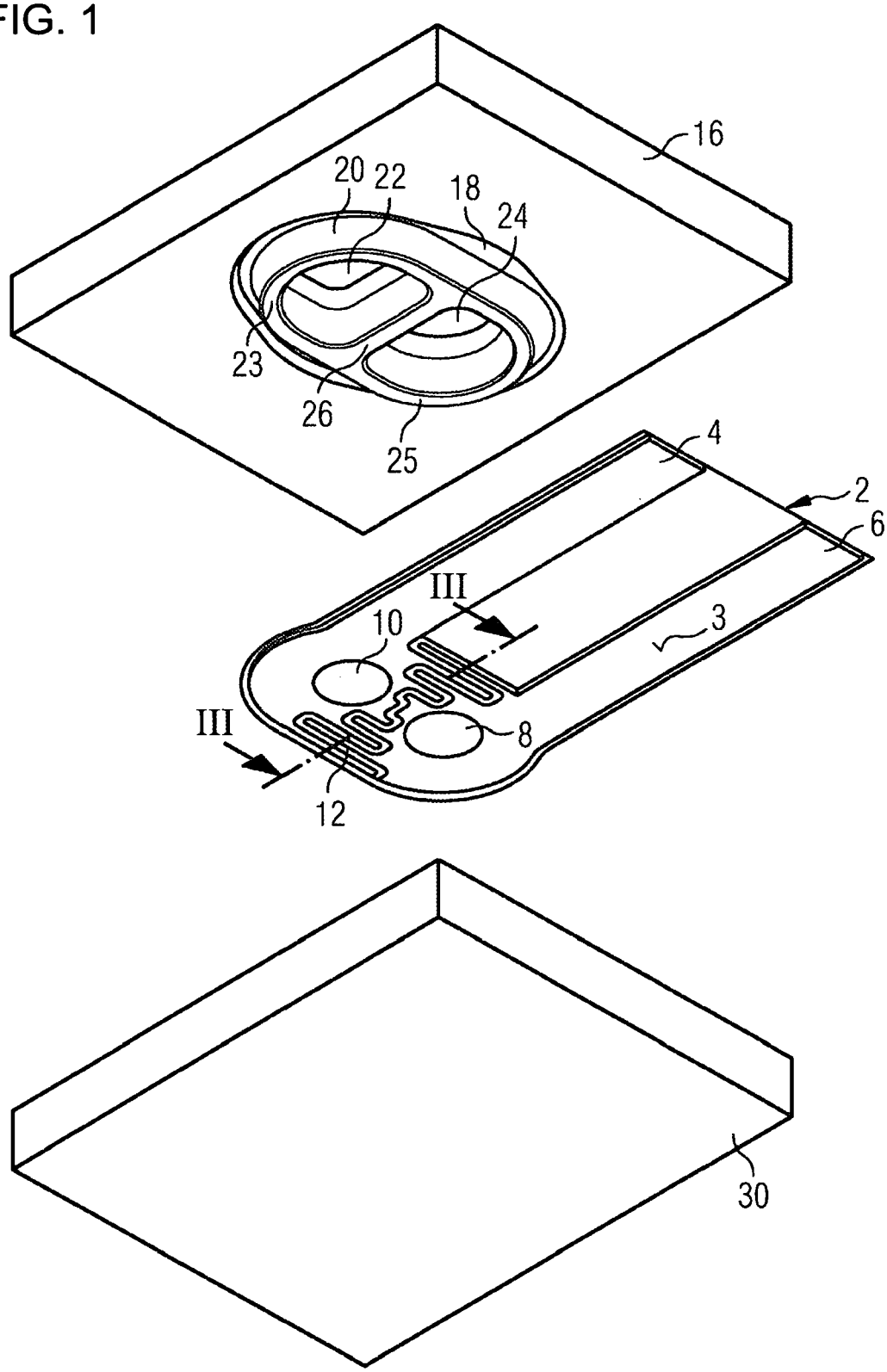
FIG. 1 is a first exploded view of an arrangement having a first embodiment variant of a conductor carrier.

Elements having the same physical design or function are identified in all figures by the same reference numerals.

Figure 2:
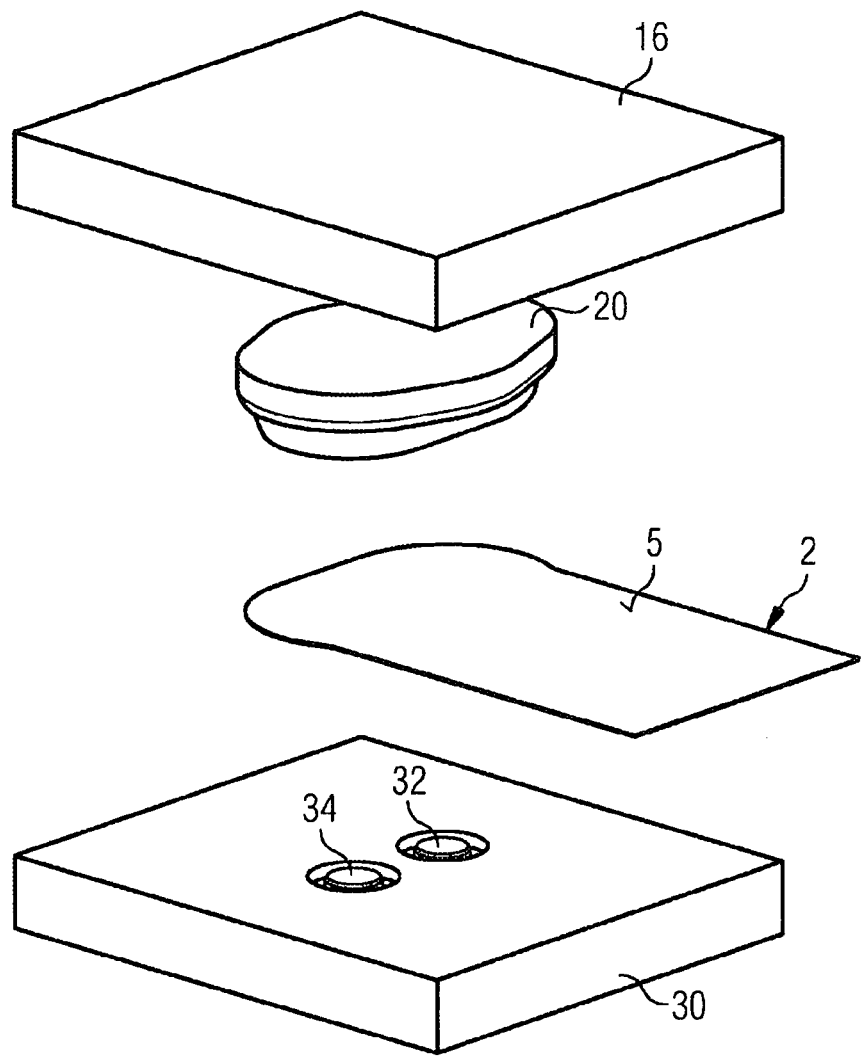
FIG. 2 is a second exploded view of the arrangement having the first embodiment variant of the conductor carrier.

One arrangement (FIG. 1) includes a conductor carrier 2. The conductor carrier 2 has a first printed conductor 4 and a second printed conductor 6. The printed conductors are made preferably of copper. The printed conductors are located between a contact-insulating film 3 and a base-insulating film 5 (FIG. 2). An insulating region 12 in which no printed conductors are embedded between the two insulating films separates the first printed conductor 4 in an insulating manner from the second printed conductor 6.

The contact-insulating film has a first and second recess 8, 10. The recesses form in each case a first overlapping region with the printed conductors. The printed conductors can thus be contacted in the region of the contact-insulating film's recesses. The insulating region 12 has a meandering course at least between the recesses of the contact-insulating film 3.

The arrangement furthermore has a base plate 16. The base plate 16 preferably has a recess 18. A pressure body 20 is located in the recess 18. The pressure body 20 can have, for example, two cylindrical partial bodies. However, the pressure body 20 preferably has a first and second pot-shaped partial body 22, 24. The pressure body furthermore preferably has an edge 23 of the first pot-shaped partial body 22 and an edge 25 of the second pot-shaped partial body 24. The edge 23 of the first pot-shaped partial body 22 and the edge 25 of the second pot-shaped partial body 24 preferably together form a separating web 26. The pressure body 20 can in an alternative embodiment variant also be embodied otherwise. What, though, is important is that the pressure body 20 will help to seal off the recesses of the contact-insulating film 3 and the contacts of the contact plate 30 from each other and from their surroundings. The pressure body 20 is made preferably of an elastic material, for example vulcanized rubber.

The arrangement furthermore preferably includes a contact plate 30. The contact plate 30 has at least two recesses in which are located a first electric contact 32 and a second electric contact 34. Electric leads can branch off from the electric contacts.

The contact-insulating film 3, the base-insulating film 5, and the printed conductors of the conductor carrier 2 are preferably embodied such that the conductor carrier 2 is very flexible.

For contacting the conductor carrier 2 at the electric contacts of the contact plate 30 the conductor carrier 2 is arranged on the contact plate 30 in such a way that the second printed conductor 6 will be coupled in the region of the first recess 8 of the contact film 3 directly to the first electric contact 32 of the contact plate 30 and that the first printed conductor 4 will be coupled in the region of the second recess 10 of the contact film 3 directly to the second electric contact 34 of the contact plate 30. The second printed conductor 6 and first printed conductor 4 can be welded to respectively the first electric contact 32 and second electric contact 34 by means of, for example, a laser.

The base plate 16 is then pressed by means of the pressure body 20 against the conductor carrier 2 and the contact plate 30 and fixed into position in such a way that the separating web 26 of the pressure body 20 will form a second overlapping region having the meandering insulating region 12. The conductor carrier 2 is furthermore pressed against the base plate 30 such that a pressure region will form in which the contact film 3 will be coupled directly to the surface of the contact plate 30. The pressure region is embodied such as to separate the recesses of the contact film 3 from each other and from their surroundings. Thus if the arrangement is located in a medium, for example oil, no particles therein will be able to penetrate the pressure region and cause short-circuiting at the electric contacts there.

Figure 3:
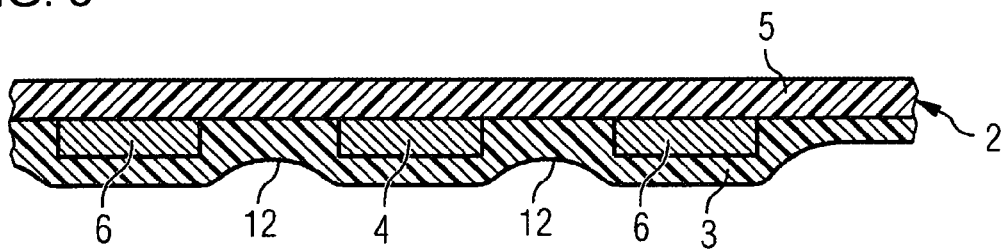
FIG. 3 shows a section through the conductor carrier shown in FIG. 1.

Owing to the absence of printed conductors in the insulating region 12 (FIG. 3) the insulating region is less raised than the region containing the printed conductors. In the second overlapping region between the insulating region 12 and separating web 26 there will consequently routinely be small spaces through which particles are able to penetrate the pressure region. The meandering course of the insulating region 12 will, though, make the ingress of particles more difficult since they will have to overcome preferably a plurality of meanders in order to reach the pressure region.

A measure of the ease or difficulty with which the particles are able to penetrate can be predefined by how the edges of the pot-shaped partial bodies of the pressure body 20 are dimensioned relative to how the meandering insulating region 12 is dimensioned. If, for instance, the edges are half as wide as the area across which the meandering insulating region 12 extends, then the particles will be able to pass between the insulating region 12 and pressure body 20 in almost a straight line. If, conversely, the edges are wider than the area across which the meandering insulating region 12 extends and/or the meandering insulating region 12 is very fine and/or very winding, then the particles will have to overcome a plurality of windings in order to penetrate the pressure region, something greatly reducing the probability of ingress. The edges will hence preferably be dimensioned such that a particle from the medium will have to overcome at least one winding of the meandering insulating region before it can penetrate the region enclosed by the pressure region.

Figure 4:
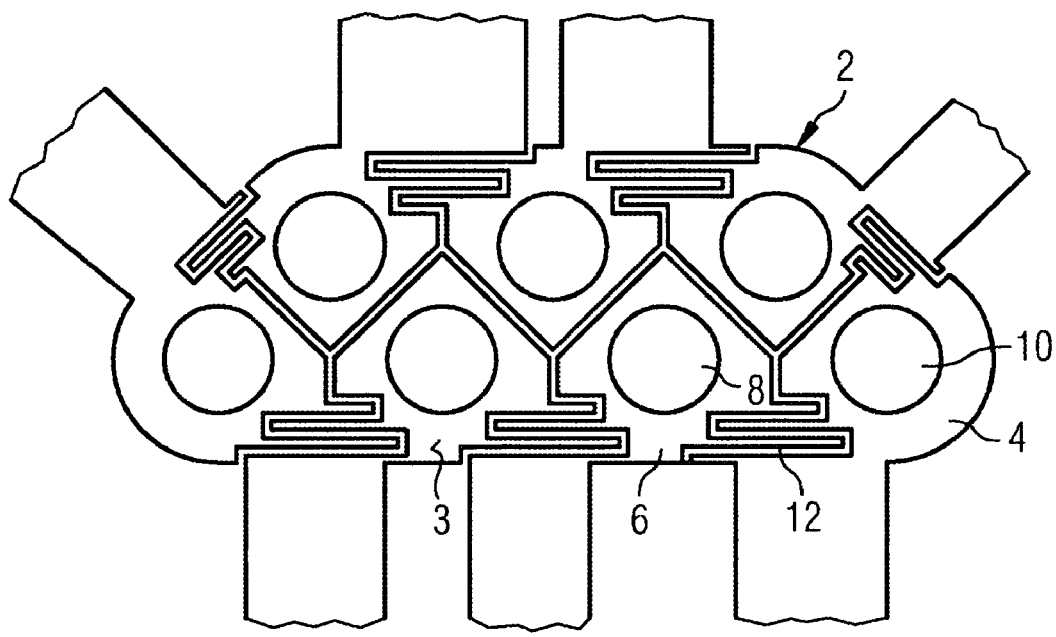
FIG. 4 shows a second embodiment variant of the conductor carrier.

In an alternative embodiment variant the conductor carrier 2 can have any number of printed conductors. The conductor carrier 2 has, for example, seven printed conductors (FIG. 4). At least one further meandering insulating region 12 will then be provided for each further printed conductor. For each further printed conductor the conductor carrier 2 furthermore has a further recess in the contact-insulating film 3. For each further printed conductor the contact plate 30 furthermore has a further electric contact. The pressure body 20 will then also be embodied such that the further recesses of the contact-insulating film 3 and the further electric contacts of the contact plate 30 are sealed off in a particle-tight manner from each other and from their surroundings.

The invention is not restricted to the exemplary embodiments presented. For example the pressure body 20 can be embodied as multi-part. The first and second pot-shaped partial body 22, 24 of the pressure body can be embodied only as cylindrical. The printed conductors can alternatively or additionally be made of materials other than copper. The conductor carrier 2 can furthermore have a plurality of layers in which insulating films and printed conductors alternate.

The invention claimed is:

1. A conductor carrier, comprising:
   a base-insulating film;
   a contact-insulating film having at least a first and a second recess;
   at least a first and a second printed conductor embedded between said insulating films, said first and second printed conductors and said first and second recesses of said contact-insulating film each forming a respective first overlapping region; and
   an insulating region separating and insulating said first printed conductor from said second printed conductor, said contact-insulating film being less raised inside said insulating region than outside said insulating region, and said insulating region extending and meandering at least between said first and second recesses of said contact-insulating film.

2. A configuration, comprising:
   a contact plate having at least a first and a second electric contact;
   a base plate;
   the conductor carrier according to claim 1 disposed between said contact plate and said base plate and electrically coupling each of said first and second printed conductors to said first and second electric contacts within said respective first overlapping regions; and a pressure body disposed between said base plate and said base-insulating film and configured for pressing said contact-insulating film against said contact plate in pressure regions each enclosing a respective one of said first and second recesses of said contact-insulating film and forming a second overlapping region with said insulating region.

3. The configuration according to claim 2, wherein said base plate has a recess, and said pressure body is located in and projects from said recess.

4. The configuration according to claim 2, wherein said pressure body has two cylindrical partial bodies with edges pressing onto said conductor carrier and defining said pressure regions.

5. The configuration according to claim 4, wherein said cylindrical partial bodies are first and second pot-shaped partial bodies having side walls defining said partial bodies.

6. The configuration according to claim 2, wherein said pressure body is constructed as a single piece.

* * * * *